(12) United States Patent
Nakamura et al.

(10) Patent No.: US 9,418,842 B2
(45) Date of Patent: Aug. 16, 2016

(54) COATING LIQUID FOR FORMING METAL OXIDE THIN FILM, METAL OXIDE THIN FILM, FIELD-EFFECT TRANSISTOR, AND METHOD FOR MANUFACTURING FIELD-EFFECT TRANSISTOR

(71) Applicants: Yuki Nakamura, Tokyo (JP); Naoyuki Ueda, Kanagawa (JP); Yukiko Abe, Kanagawa (JP); Yuji Sone, Kanagawa (JP); Shinji Matsumoto, Kanagawa (JP); Mikiko Takada, Kanagawa (JP); Ryoichi Saotome, Kanagawa (JP)

(72) Inventors: Yuki Nakamura, Tokyo (JP); Naoyuki Ueda, Kanagawa (JP); Yukiko Abe, Kanagawa (JP); Yuji Sone, Kanagawa (JP); Shinji Matsumoto, Kanagawa (JP); Mikiko Takada, Kanagawa (JP); Ryoichi Saotome, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/361,150

(22) PCT Filed: Nov. 28, 2012

(86) PCT No.: PCT/JP2012/081426
§ 371 (c)(1),
(2) Date: May 28, 2014

(87) PCT Pub. No.: WO2013/081167
PCT Pub. Date: Jun. 6, 2013

(65) Prior Publication Data
US 2014/0299877 A1    Oct. 9, 2014

(30) Foreign Application Priority Data

Nov. 30, 2011    (JP) .................................. 2011-261991

(51) Int. Cl.
*H01L 21/02* (2006.01)
*H01L 29/786* (2006.01)
(Continued)

(52) U.S. Cl.
CPC .... *H01L 21/02554* (2013.01); *H01L 21/02565* (2013.01); *H01L 21/02573* (2013.01); *H01L 21/02628* (2013.01); *H01L 29/221* (2013.01);
(Continued)

(58) Field of Classification Search
CPC ............ H01L 29/7869; H01L 27/1225; H01L 21/02565; H01L 21/02554
USPC ............................................. 257/43; 438/104
See application file for complete search history.

(56) References Cited

U.S. PATENT DOCUMENTS

| 2001/0022148 A1 | 9/2001 | Onazawa et al. | |
| 2003/0185971 A1* | 10/2003 | Saksa et al. | 427/96 |
| 2005/0074589 A1* | 4/2005 | Pan et al. | 428/206 |

(Continued)

FOREIGN PATENT DOCUMENTS

| JP | 06-096619 | 4/1994 |
| JP | 07-320541 | 12/1995 |

(Continued)

OTHER PUBLICATIONS

Doo Hyun Yoon, "Investigation of solution-processed amorphous SrInZnO thin film transistors," J. Crystal Growth, 2011, vol. 326, No. 1, pp. 171-174.*

(Continued)

*Primary Examiner* — Tucker J Wright
(74) *Attorney, Agent, or Firm* — Cooper & Dunham LLP

(57) ABSTRACT

A coating liquid for forming a metal oxide thin film includes: an inorganic indium compound; an inorganic calcium compound or an inorganic strontium compound, or both thereof; and an organic solvent.

13 Claims, 5 Drawing Sheets

(51) Int. Cl.
*H01L 29/221* (2006.01)
*H01L 29/66* (2006.01)
(52) U.S. Cl.
CPC ...... *H01L 29/66969* (2013.01); *H01L 29/7869* (2013.01)

(56) References Cited

U.S. PATENT DOCUMENTS

| | | | | |
|---|---|---|---|---|
| 2007/0278481 | A1* | 12/2007 | Lee et al. | 257/40 |
| 2008/0197346 | A1* | 8/2008 | Moon et al. | 257/40 |
| 2009/0090914 | A1* | 4/2009 | Yano et al. | 257/66 |
| 2009/0173938 | A1* | 7/2009 | Honda et al. | 257/43 |
| 2010/0072435 | A1 | 3/2010 | Honda et al. | |
| 2010/0163861 | A1* | 7/2010 | Brazis, Jr. | 257/43 |
| 2011/0124152 | A1 | 5/2011 | Ahn et al. | |
| 2013/0240881 | A1 | 9/2013 | Nakamura et al. | |

FOREIGN PATENT DOCUMENTS

| | | |
|---|---|---|
| JP | 2001-234343 | 8/2001 |
| JP | 2006-332629 | 12/2006 |
| JP | 2009-120873 | 6/2009 |
| JP | 2009-177149 | 8/2009 |
| JP | 2010-077463 | 4/2010 |
| JP | 2010-258057 | 11/2010 |
| KR | 10-2008-0003889 | 1/2008 |
| WO | WO2007/058248 | 5/2007 |
| WO | WO2012/073913 A1 * | 6/2012 |

OTHER PUBLICATIONS

International Search Report Issued for counterpart International Patent Application No. PCT/JP2012/081426 dated Mar. 12, 2013.
Doo Hyun Yoon, Investigation of solution-processed amorphous SrInZnO thin film transistors, Journal of Crystal Growth, Jul. 1, 2011, vol. 326, No. 1, pp. 171-174.
Dec. 15, 2014 Taiwanese official action (and English-language translation thereof) in corresponding Taiwanese patent application No. 101144794.
Mar. 11, 2015 European search report in corresponding European patent application No. 12852690.2.
Korean official action (and English translation thereof) dated Sep. 8, 2015 in corresponding Korean Patent Application No. 10-2014-7017669.
Korean official action dated May 26, 2016 (and English translation) in corresponding Korean patent application No. 10-2014-7017669.

* cited by examiner

COATING LIQUID FOR FORMING METAL OXIDE THIN FILM, METAL OXIDE THIN FILM, FIELD-EFFECT TRANSISTOR, AND METHOD FOR MANUFACTURING FIELD-EFFECT TRANSISTOR

TECHNICAL FIELD

The present invention relates to a coating liquid for forming a metal oxide thin film, a metal oxide thin film, a field-effect transistor, and a method for manufacturing a field-effect transistor.

BACKGROUND ART

Conventionally, metal oxides such as antimony-doped tin oxide (ATO) and tin-doped indium oxide (ITO) are used as a transparent conductive film for an electrode of display element such as liquid crystal display element and electroluminescence display element, and a heating resistor in a window glass of an automobile, an aircraft or a building for anti-fogging or anti-icing purpose.

In recent years, it has been found that oxide semiconductors such as ZnO, $In_2O_3$ and In—Ga—Zn—O as one type of the metal oxides are semiconductors that exhibit high carrier mobility compared to an amorphous silicon, and development of a field-effect transistor (FET: Field-Effect Transistor) in which these oxide semiconductors are used in its active layer has been active.

As a method for forming a thin layer of such metal oxides, a vacuum deposition method and a sputtering method are common. For example, a semiconductor thin layer which employs a vacuum deposition technology such as sputtering and which includes indium, positive divalent element (especially, zinc, magnesium, copper, cobalt, nickel, calcium) and oxygen and has a specific resistance of $10^{-1}$ Ωcm to $10^8$ Ωcm is proposed (see PTL1).

However, there is a problem that a complex and expensive apparatus is required for implementing these methods. There is also a problem that it is difficult to form a thin layer with a large area.

Thus, as a method which is easier and enables a large area, a coating solution that an inorganic metal compound or an organic metal compound is dissolved in an organic solvent and that another metal is added as an activator to impart higher electrical conductivity, and a coating method which uses the coating solution have been studied.

For example, for the purpose of forming a thin layer having a high electrical conductivity and transmittance, a composition for forming a transparent conductive film including an organic compound which may be coordinated to an inorganic indium compound, magnesium compound and indium is proposed (see PTL2). Also, a composition for forming a transparent conductive film that indium nitrate, a condensate of a polyhydric alcohol and an activator is dissolved in an organic solvent is proposed (see PTL3).

However, these proposed technologies are technologies of a composition for forming a transparent conductive film, and a sufficient functionality as an active layer of a field-effect transistor cannot be obtained with the obtained transparent conductive film, and there is a problem that available applications are limited.

Also, a metal oxide precursor solution that an inorganic metal salt as a metal oxide precursor is dissolved in water or ethanol as a solvent and a method for preparing an oxide semiconductor by coating the metal oxide precursor solution on a substrate are proposed (see PTL4). With this proposed technology, the oxide semiconductor is considered as an active layer of a field-effect transistor.

However, with this proposed technology, the coating solution spreads thinly when the metal oxide precursor solution is coated on the substrate, and there is a problem of low precision of a shape of the obtained oxide semiconductor.

Thus, there currently is being asked to provide a coating liquid for forming a metal oxide thin film which enables to produce a metal oxide thin film having a desired volume resistivity easily and in a large area and which has a high precision for forming a metal oxide of a desired shape.

CITATION LIST

Patent Literature

PTL1 International Publication No. WO 2007/058248
PTL2 Japanese Patent Application Laid-Open (JP-A) No. 06-96619
PTL3 JP-A No. 07-320541
PTL4 JP-A No. 2009-177149

SUMMARY OF INVENTION

Technical Problem

The present invention aims at solving the above problems in the conventional technologies and at achieving the following objection. That is, the present invention aims at providing a coating liquid for forming a metal oxide thin film which enables to produce a metal oxide thin film having a desired volume resistivity easily and in a large area and which has a high precision for forming a metal oxide of a desired shape.

Solution to Problem

Means for solving the problems are as follows. That is:
A coating liquid for forming a metal oxide thin film of the present invention includes: an inorganic indium compound; an inorganic calcium compound or an inorganic strontium compound, or both thereof; and an organic solvent.

Advantageous Effects of Invention

According to the present invention, the various problems in the conventional technologies may be solved, and a coating liquid for forming a metal oxide thin film which enables to produce a metal oxide thin film having a desired volume resistivity easily and in a large area and which has a high precision for forming a metal oxide of a desired shape may be provided.

Figure 1:
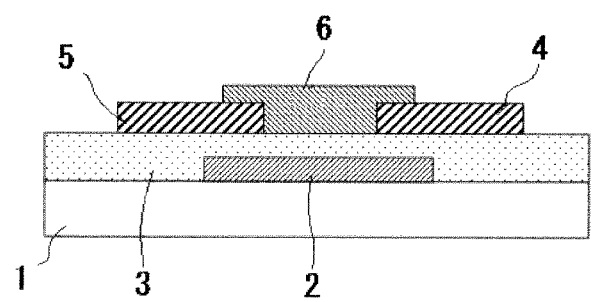
FIG. 1 is a schematic configuration diagram illustrating one example of a bottom gate/bottom contact field-effect transistor.

DESCRIPTION OF EMBODIMENTS (Coating Liquid for Forming Metal Oxide Thin Film)

A coating liquid for forming a metal oxide thin film of the present invention includes: an inorganic indium compound; an inorganic calcium compound or an inorganic strontium compound, or both thereof; and an organic solvent, and it further includes other components according to necessity.

By using the coating liquid for forming a metal oxide thin film, a metal oxide thin having a desired volume resistivity may be obtained.

Here, with the coating liquid for forming a metal oxide thin film, it is possible to control the volume resistivity of the metal oxide thin film to be obtained (e.g. oxide semiconductor thin layer) by varying its conditions, specifically types of the solvent for dissolution and a concentration of the inorganic compounds. The volume resistivity may also be controlled by substituting a part of respective elements constituting the In—Mg oxide and the In—Zn oxide by other metals The volume resistivity may also be controlled by heat treatment conditions after coating, specifically a baking temperature, a baking time, a heating rate, a cooling rate and an atmosphere during baking (gas fraction and pressure).

Further, it is possible to use an effect of promoting decomposition and reaction of the raw materials by light. In addition, since the volume resistivity changes also by annealing after forming the film, optimization of an annealing temperature and atmosphere is also effective.

<Inorganic Indium Compound>

The inorganic indium compound is not particularly restricted and may be appropriately selected according to purpose. Examples thereof include indium oxo acid, indium halide, indium hydroxide, and indium cyanide.

Examples of the indium oxo acid include indium nitrate, indium sulfate, indium carbonate, and indium phosphate.

Examples of the indium halide include indium chloride, indium bromide, and indium iodide.

Among these, indium oxo acid and indium halide are preferable, and indium nitrate, indium sulfate, and indium chloride are more preferable in view of high solubility to various solvents.

The indium nitrate is not particularly restricted and may be appropriately selected according to purpose. Examples thereof include a hydrate of indium nitrate. Examples of the hydrate of indium nitrate include indium nitrate trihydrate and indium nitrate pentahydrate.

The indium sulfate is not particularly restricted and may be appropriately selected according to purpose. Examples thereof include anhydrous indium sulfate and a hydrate of indium sulfate. Examples of the hydrate of indium sulfate include indium sulfate nonahydrate.

The indium chloride is not particularly restricted and may be appropriately selected according to purpose. Examples thereof include a hydrate of indium chloride. Examples of the hydrate of indium chloride include indium chloride tetrahydrate.

As these inorganic indium compounds, those synthesized may be used, or commercially available products may be used.

<Inorganic Calcium Compound and Inorganic Strontium Compound>

—Inorganic Calcium Compound—

The inorganic calcium compound is not particularly restricted and may be appropriately selected according to purpose. Examples thereof include calcium oxo acid, calcium halide, calcium hydroxide, and calcium cyanide.

Examples of the calcium oxo acid include calcium nitrate, calcium sulfate, calcium carbonate, and calcium phosphate.

Examples of the calcium halide include calcium chloride, calcium bromide and calcium iodide.

Among these, calcium oxo acid and calcium halide are preferable, and calcium nitrate, calcium sulfate, and calcium chloride are more preferable since in view of high solubility to various solvents.

The calcium nitrate is not particularly restricted and may be appropriately selected according to purpose. Examples thereof include a hydrate of calcium nitrate. Examples of the hydrate of calcium nitrate include calcium nitrate trihydrate and calcium nitrate hexahydrate.

The calcium sulfate is not particularly restricted and may be appropriately selected according to purpose. Examples thereof include a hydrate of calcium sulfate. Examples of the hydrate of calcium sulfate include calcium sulfate monohydrate and calcium sulfate heptahydrate.

The calcium chloride is not particularly restricted and may be appropriately selected according to purpose. Examples thereof include a hydrate of calcium chloride. Examples of the hydrate of calcium chloride include calcium chloride hexahydrate.

As these inorganic calcium compounds, those synthesized may be used, or commercially available products may be used.

—Inorganic Strontium Compound—

The inorganic strontium compound is not particularly restricted and may be appropriately selected according to purpose. Examples thereof include strontium oxo acid, strontium halide, strontium hydroxide, and strontium cyanide.

Examples of the strontium oxo acid include strontium nitrate, strontium sulfate, strontium carbonate, and strontium phosphate.

Examples of the strontium halide include strontium chloride, strontium bromide, and strontium iodide.

Among these, strontium oxo acid and strontium halide are preferable, and strontium nitrate, strontium sulfate, and strontium chloride are more preferable in view of high solubility to various solvents.

The strontium nitrate is not particularly restricted and may be appropriately selected according to purpose. Examples thereof include a hydrate of strontium nitrate. Examples of the hydrate of strontium nitrate include strontium nitrate trihydrate and strontium nitrate hexahydrate.

The strontium sulfate is not particularly restricted and may be appropriately selected according to purpose. Examples thereof include anhydrous strontium sulfate and a hydrate of strontium sulfate. Examples of the hydrate of strontium sulfate include strontium sulfate dehydrate and strontium sulfate heptahydrate.

The strontium chloride is not particularly restricted and may be appropriately selected according to purpose. Examples thereof include anhydrous strontium chloride and a hydrate of strontium chloride. Examples of the hydrate of strontium chloride include strontium chloride dihydrate, and strontium chloride tetrahydrate.

As these inorganic strontium compounds, those synthesized may be used, or commercially available products may be used.

A number of indium ions (A) in the inorganic indium compound and a sum (B) of a number of calcium ions in the inorganic calcium compound and a number of strontium ions in the inorganic strontium compound in the coating liquid for forming a metal oxide thin film preferably satisfy Formula (1) below.

$$0.040 \leq [B/(A+B)] \leq 0.200 \quad \text{Formula (1).}$$

The coating liquid for forming a metal oxide thin film which satisfies Formula (1) above may also be referred to as a coating solution for forming an oxide semiconductor thin layer.

It has been known that, as an indium oxide film by a sputtering method, a film having a low resistivity of around $10^{-3}$ Ωcm to $10^{-4}$ Ωcm may be obtained by adding a few % to about 20% of tin, zinc, or gallium. However, the film with such a low volume resistivity does not function effectively as an active layer of a field-effect transistor.

When the coating liquid for forming a metal oxide thin film satisfies Formula (1) above, the oxide semiconductor thin layer formed by coating the coating liquid for forming a metal oxide thin film has a volume resistivity for effectively functioning as an active layer of a field-effect transistor.

When the [B/(A+B)] is less than 0.040, the volume resistivity of the obtained oxide semiconductor thin layer is too low, and the field-effect transistor which uses the oxide semiconductor thin layer as the active layer does not function as a transistor since the active layer is always turned on with or without an application of a gate voltage. When the [B/+B)] exceeds 0.200, the volume resistivity of the obtained oxide semiconductor thin layer is too high, and the field-effect transistor which uses the oxide semiconductor thin layer as the active layer does not demonstrate favorable transistor characteristics due to a low ON/OFF ratio.

It is required for the oxide semiconductor thin layer used for the active layer of the field-effect transistor used for a drive circuit of a display, for example, to have high carrier mobility and so-called normally-off characteristic. In order to achieve high carrier mobility and normally-off characteristic, the volume resistivity of the oxide semiconductor thin layer is more preferably $10^{-2}$ Ωcm to $10^9$ Ωcm.

When the volume resistivity of the metal oxide thin film used in the active layer is high, it may be difficult to achieve high carrier mobility in an ON state by a gate voltage control. Thus, the volume resistivity of the metal oxide thin film is more preferably $10^6$ Ωcm or less.

When the volume resistivity of the metal oxide thin film used in the active layer is low, it may be difficult to reduce Ids (drain-source current) in an OFF state by a gate voltage control. Thus, the volume resistivity of the metal oxide thin film is more preferably $10^{-1}$ Ωcm or greater.

The volume resistivity ρ (Ωcm) of the metal oxide is subject to Formula (2) below.

$$\rho = 1/nQ\mu \quad \text{Formula (2)}$$

Here, in the formula, Q (C) represents carrier charge, n (number/ms) represents carrier density, and μ ($m^2/V/s$) represents carrier mobility.

Thus, the volume resistivity may be controlled by varying these n, Q, and μ.

Examples of a specific method for controlling the volume resistivity of the metal oxide thin film include, in general, a method to change the carrier density by adjusting an amount of oxygen (density of oxygen defect) in the film.

The oxide semiconductor thin layer effective as an active layer of a field-effect transistor with its volume resistivity controlled may be obtained by satisfying Formula (1) above of the coating liquid for forming a metal oxide thin film.

It is the most effective to satisfy the range of Formula (1) above as a method for controlling the volume resistivity of the oxide semiconductor thin layer formed with the coating liquid for forming a metal oxide thin film.

<Organic Solvent>

The organic solvent is not particularly restricted and may be appropriately selected according to purpose. Glycol ethers and diols are preferable. That is, the coating liquid for forming a metal oxide thin film preferably includes the glycol ethers or the diols, or any combination thereof.

—Glycol Ethers—

The glycol ethers well dissolve the inorganic indium compound, the inorganic calcium compound, and the inorganic strontium compound, and stability after dissolution is high. Thus, a metal oxide thin film (e.g. oxide semiconductor thin layer) with high uniformity and a small number of defects may be obtained by using the glycol ethers in the coating liquid for forming a metal oxide thin film.

Also, by using the glycol ethers in the coating liquid for forming a metal oxide thin film, a metal oxide thin film (e.g. oxide semiconductor thin layer) having a desired shape may be formed with high precision.

Also, the glycol ethers are considered to work as a reducing agent. An In—Ca oxide semiconductor and an In—Sr oxide semiconductor as an n-type semiconductor generate a conduction electron due to occurrence of an oxygen defect, and thus the material may have a higher conductivity with the equilibrium shifted to the reduction side. Accordingly, incorporation of the glycol ethers in the coating liquid for forming a metal oxide thin film triggers a reduction action during heat treatment after coating, and the oxide semiconductor thin layer having a smaller volume resistivity may be obtained.

The glycol ethers are not particularly restricted and may be appropriately selected according to purpose. Alkylene glycol monoalkyl ether is preferable. The glycol ethers preferably have 3 to 6 carbon atoms.

As the alkylene glycol monoalkyl ether, ethylene glycol monoethyl ether, ethylene glycol monomethyl ether, ethylene glycol mono-propyl ether, ethylene glycol mono-isopropyl ether, ethylene glycol monobutyl ether, or ethylene glycol mono-isobutyl ether, or any combination thereof is preferable. The coating liquid for forming a metal oxide thin film dries quickly and hardly spreads with these alkylene glycol monoalkyl ethers having a boiling point of about 120° C. to 180° C. With such a preferable compound, a baking temperature is reduced, and baking in a relatively short period of time becomes possible. In addition, the metal oxide thin film (e.g. oxide semiconductor thin layer) having less impurities may be obtained after baking. As a result, carrier mobility increases, and a rising slope for switching from OFF to ON increases in a plot showing a relation between the gate voltage Vgs and the source-drain current Ids in a field-effect transistor in which the oxide semiconductor thin layer is used as the active layer. Thus, switching characteristic improves, and a driving voltage to obtain a required ON-state current is reduced.

These may be used alone or in combination of two or more.

A content of the glycol ethers in the coating liquid for forming a metal oxide thin film is not particularly restricted and may be appropriately selected according to purpose. It is preferably 10% by mass to 80% by mass. When the content is less than 10% by mass, the above-mentioned effects of the addition of the glycol ethers may not be obtained. When it exceeds 80% by mass, a thickness of the metal oxide thin film (e.g. oxide semiconductor thin layer) formed by single coating may decrease.

—Diols—

The glycol ethers are preferably used in combination with diols. By combining the glycol ethers with the diols, by an action of the diols, clogging in an inkjet nozzle due to the solvent drying during coating with an inkjet method may be removed. Moreover, due to an action of the glycol ethers, the coating solution adhered to the substrate dries quickly, for example, and spreading of the coating solution to unwanted sections is suppressed. For example, it is possible to dry quickly the coating solution adhered to a channel and to prevent it from spreading other than a channel region in manufacturing a field-effect transistor.

In addition, since the glycol ethers usually have a low viscosity of about 1.3 cP to 3.5 cP, by mixing them with the dials having a high viscosity, viscosity of the coating liquid for forming a metal oxide thin film may be easily adjusted.

It is considered that the diols coordinate to an indium salt, a calcium salt, a strontium salt, a magnesium salt or a zinc salt to enhance thermal stability of the metal salt.

The diols are not particularly restricted and may be appropriately selected according to purpose. Alkane diols and dialkylene glycols are preferable. The dials preferably have 2 to 4 carbon atoms. When the number of carbon atoms is 5 or greater, the dials have low volatility and tend to remain in the formed metal oxide thin film (e.g. oxide semiconductor thin layer), resulting in reducing the denseness of the metal oxide thin film (e.g. oxide semiconductor thin layer) after baking. When the denseness of the oxide semiconductor thin layer decreases, the carrier mobility degreases, and the ON-state current may decrease.

Since the diols having 2 to 4 carbon atoms have a boiling point of about 180° C. to 250° C., they volatilize during baking after coating the coating liquid for forming a metal oxide thin film, and they hardly remain in the metal oxide thin film (e.g. oxide semiconductor thin layer). Also, they have a viscosity of about 10 cP to 110 cP, an effect of suppressing the coating liquid for forming a metal oxide thin film spreading on a substrate, for example, may be achieved in coating the coating liquid for forming a metal oxide thin film by an inkjet method As the diols, diethylene glycol, 1,2-ethanediol, 1,2-propanediol or 1,3-butanediol, or any combination thereof is more preferable in view of the baking temperature and denseness of the metal oxide thin film (e.g. oxide semiconductor thin layer) after baking.

These may be used alone or in combination of two or more.

The content of the organic solvent in the coating liquid for forming a metal oxide thin film is not particularly restricted and may be appropriately selected according to purpose. It is preferably 50% by mass to 97% by mass, and more preferably 80% by mass to 97% by mass. When the content is less than 50% by mass, a concentration of the inorganic metal compound is too high, and the inorganic metal compounds are likely to precipitate due to evaporation of the solvent at a tip of a nozzle. In addition, in the case where a majority of the balance is water as a typical inorganic solvent, the nozzle is easily clogged since water has a large surface tension of 72 dyn/cm, resulting in poor discharge properties, and an ink dries quickly at the tip of the nozzle due to its low boiling point of 100° C. When the content exceeds 97% by mass, an amount of the inorganic metal compound after drying the coating solution is small, and a number of recoating to obtain the metal oxide thin film having a required thickness increases, resulting in reduced productivity. When the content is within the more preferable range, the surface tension is reduced, which is advantageous in terms of discharge properties and drying properties.

A proportion of the metal salt in the coating liquid for forming a metal oxide thin film and the organic solvent (e.g. the diols and the glycol ethers) is not particularly restricted and may be appropriately selected according to purpose. It is preferably 0.1 mol to 0.5 mol of the metal salt with respect to 1 L of the organic solvent. When the proportion of the metal salt is less than 0.1 mol, the thickness of the metal oxide thin film formed after baking is too small, and it may become difficult to form a continuous film. Also, it may become necessary to carry out coating and drying repeatedly in order to obtain a required thickness. When the proportion of the metal salt exceeds 0.5 mol, clogging of the nozzle at the tip of the inkjet nozzle may occur more frequently in applying by the inkjet method.

<Other Components>

Examples of the other components include an inorganic magnesium compound and an inorganic zinc compound.

—Inorganic Magnesium Compound and Inorganic Zinc Compound—

Magnesium included in the inorganic magnesium compound and zinc included in the inorganic zinc compound act as a dopant to replace an indium site and have an effect of hole doping in the metal oxide thin film (e.g. oxide semiconductor thin layer) obtained by coating the coating liquid for forming a metal oxide thin film.

The inorganic magnesium compound is not particularly restricted and may be appropriately selected according to purpose. Examples thereof include magnesium oxo acid, halogenated magnesium, magnesium hydroxide, and magnesium cyanide.

Examples of the magnesium oxo acid include magnesium nitrate, magnesium sulfate, magnesium carbonate, and magnesium phosphate.

Examples of the halogenated magnesium include magnesium chloride, magnesium bromide, and magnesium iodide.

These may be an anhydride or a hydrate.

The inorganic zinc compound is not particularly restricted and may be appropriately selected according to purpose. Examples thereof include zinc oxo acid, halogenated zinc, zinc hydroxide, and zinc cyanide.

Examples of the zinc oxo acid include zinc nitrate, zinc sulfate, zinc carbonate, and zinc phosphate.

Examples of the halogenated zinc include zinc chloride, zinc bromide, and zinc iodide.

These may be an anhydride or a hydrate.

These may be used alone or in combination of two or more.

The content of the inorganic magnesium compound and the inorganic zinc compound in the coating liquid for forming a metal oxide thin film is not particularly restricted and may be appropriately selected according to purpose. A sum (C) of a number of magnesium ions and a number of zinc ions is preferably 1% to 30% with respect to the number of indium ions (A).

<Method for Preparing Coating Liquid for Forming Metal Oxide Thin Film>

A method for preparing the coating liquid for forming a metal oxide thin film is not particularly restricted and may be appropriately selected according to purpose. Examples thereof include a method to prepare a diol nitrate solution and a glycol ether nitrate solution separately and to mix them.

A specific example of the preparation method is described below.

First, indium nitrate ($In(NO_3)_3 \cdot 3H_2O$) and calcium nitrate ($Ca(NO_3)_2 \cdot 4H_2O$) are dissolved in the diols, and a diol nitrate solution is prepared. By stirring, it is possible to dissolve indium nitrate and calcium nitrate in diethylene glycol, 1,2-ethanediol, 1,2-propanediol, and 1,3-butanediol as the diols at a room temperature to a respective concentration of 1 mol/L or greater. The time for dissolution may be reduced by heating during the dissolution.

Next, indium nitrate ($In(NO_3)_3 \cdot 3H_2O$) and calcium nitrate ($Ca(NO_3)_2 \cdot 4H_2O$) are dissolved in the glycol ethers, and a glycol ether nitrate solution is prepared. By stirring, it is possible to dissolve indium nitrate and calcium nitrate in ethylene glycol monoethyl ether, ethylene glycol monomethyl ether, ethylene glycol mono-propyl ether, ethylene glycol mono-isopropyl ether, ethylene glycol monobutyl ether, and ethylene glycol mono-isobutyl ether as the glycol ethers at a room temperature to a respective concentration of 1 mol/L or greater. The time for dissolution may be reduced by heating during the dissolution.

The diol nitrate solution and the glycol ether nitrate solution respectively prepared are mixed at a desired proportion.

A coating liquid for forming a metal oxide thin film of the present invention is suitable as a coating solution for preparing a metal oxide thin film. In particular, a coating liquid for forming a metal oxide thin film (a coating solution for forming an oxide semiconductor thin layer) which satisfies Formula (1) is suitable as a coating solution for preparing an active layer of a field-effect transistor.

(Metal Oxide Thin Film)

A metal oxide thin film of the present invention may be obtained by coating and drying the coating liquid for forming a metal oxide thin film of the present invention on an object to be coated followed by baking.

Examples of the metal oxide thin film include an oxide semiconductor thin layer.

When a coating liquid for forming a metal oxide thin film (coating solution for forming an oxide semiconductor thin layer) which satisfies Formula (1) above is used as the coating liquid for forming a metal oxide thin film, an oxide semiconductor thin layer suitable as an active layer of a field-effect transistor may be obtained.

The object to be coated is not particularly restricted and may be appropriately selected according to purpose. Examples thereof include a glass substrate and a plastic substrate.

Also, when the metal oxide thin film is used as the oxide semiconductor thin layer for the active layer of the field-effect transistor, examples of the object to be coated include a substrate and a gate insulating layer. A shape, structure and size of the substrate are not particularly restricted, and they may be appropriately selected according to purpose. A material of the substrate is not particularly restricted, and it may be appropriately selected according to purpose. Examples thereof include a glass substrate and a plastic substrate.

The coating method is not particularly restricted and may be appropriately selected according to purpose. Examples thereof include a screen printing method, a roll coating method, a dip-coating method, a spin coating method, an inkjet method, and a nanoimprint method. Among these, the inkjet method and the nanoimprint method which enables to control an adhered amount of the coating solution are preferable since a designed channel width (in other words, desired shape of the active layer) may be obtained in manufacturing a metal oxide thin film having a desired shape such as field-effect transistor. In coating by the inkjet method and the nanoimprint method, coating is possible at a room temperature, but heating the substrate (object to be coated) to about 40° C. to 100° C. is preferable since the coating solution immediately after coating spreading on a surface of the substrate may be suppressed.

The drying is not particularly restricted as long as it is carried out in a condition to remove the volatile components in the coating liquid for forming a metal oxide thin film, and it may be appropriately selected according to purpose. In the drying, it is unnecessary to remove the volatile component completely, and the volatile component is removed to an extent that it does not inhibit the baking.

The baking temperature is not particularly restricted as long as it is between a temperature at which indium, calcium, strontium, magnesium and zinc forms an oxide and a temperature at which the substrate (coating object) is thermally deformed, and it may be appropriately selected according to purpose. It is preferably 250° C. to 600° C.

The baking atmosphere is not particularly restricted and may be appropriately selected according to purpose. Examples thereof include an atmosphere including oxygen, e.g. in oxygen or in air. Also, with an inert gas such as nitrogen gas as the baking atmosphere, an amount of oxygen in the metal oxide thin film (e.g. oxide semiconductor thin layer) film to be formed may be reduced, and the metal oxide thin film (e.g. oxide semiconductor thin layer) having a low resistivity may be obtained.

After baking, by subjecting further to annealing in an atmosphere of an air, an inert gas or a reduced gas, electrical characteristics, reliability and uniformity of the metal oxide film thin layer (e.g. oxide semiconductor film thin layer) may further be improved.

A time for the baking is not particularly restricted and may be appropriately selected according to purpose.

An average thickness of the metal oxide thin film (e.g. oxide semiconductor thin layer) to be formed is not particularly restricted and may be appropriately selected according to purpose. It is preferably 1 nm to 200 nm, and more preferably 5 nm to 100 nm.

Use of the metal oxide thin film is not particularly restricted and may be appropriately selected according to purpose. For example, it may be used for a transparent conductive film when the metal oxide thin film has a volume resistivity of less than $10^{-2}$ Ωcm; it may be used for an active layer of a field-effect transistor when the volume resistivity is $10^{-2}$ Ωcm to $10^9$ Ωcm and it may be used for an antistatic thin layer when the volume resistivity exceeds $10^9$ Ωcm.

(Field-Effect Transistor)

A field-effect transistor of the present invention includes at least: a gate electrode, a source electrode, a drain electrode, an active layer, and a gate insulating layer, and it further includes other members according to necessity.

The field-effect transistor of the present invention may be manufactured, for example, by a method for manufacturing a field-effect transistor of the present invention.

<Gate Electrode>

The gate electrode is not particularly restricted as long as it is an electrode for applying a gate voltage, and it may be appropriately selected according to purpose.

A material of the gate electrode is not particularly restricted and may be appropriately selected according to purpose. Examples thereof include: metals such as platinum, palladium, gold, silver, copper, zinc, aluminum, nickel, chromium, tantalum, molybdenum and titanium; alloys thereof; and mixtures of these metals. The examples further include: electrically conductive oxides such as indium oxide, zinc oxide, tin oxide, gallium oxide and niobium oxide; composite compounds thereof and mixtures thereof.

An average thickness of the gate electrode is not particularly restricted and may be appropriately selected according to purpose. It is preferably 40 nm to 2 µm, and more preferably 70 nm to 1 µm.

<Gate Insulating Layer>

The gate insulating layer is not particularly restricted as long as it is an insulating layer formed between the gate electrode and the active layer, and it may be appropriately selected according to purpose.

A material of the gate insulating layer is not particularly restricted and may be appropriately selected according to purpose. Examples thereof include an inorganic insulating material and an organic insulating material.

Examples of the inorganic insulating material include silicon oxide, aluminum oxide, tantalum oxide, titanium oxide, yttrium oxide, lanthanum oxide, hafnium oxide, zirconium oxide, silicon nitride, aluminum nitride, and a mixture thereof.

Examples of the organic insulating material include polyimide, polyamide, polyacrylate, polyvinyl alcohol, and novolak resin.

An average thickness of the gate insulating layer is not particularly restricted and may be appropriately selected according to purpose. It is preferably 50 nm to 3 µm, and more preferably 100 nm to 1 µm.

<Source Electrode and Drain Electrode>

The source electrode and the drain electrode are not particularly restricted as long as they are electrodes for retrieving a current, and they may be appropriately selected according to purpose.

A material of the source electrode and the drain electrode is not particularly restricted and may be appropriately selected according to purpose. Examples thereof include the materials described for explaining the gate electrode.

An average thickness of the source electrode and the drain electrode is not particularly restricted and may be appropriately selected according to purpose. It is preferably 40 nm to 2 µm, and more preferably 70 nm to 1 µm.

<Active Layer>

The active layer is an active layer formed of an oxide semiconductor formed between the source electrode and the drain electrode, and it is formed of oxide semiconductor formed by coating the coating liquid for forming a metal oxide thin film of the present invention.

An average thickness of the active layer is not particularly restricted and may be appropriately selected according to purpose. It is preferably 1 nm to 200 µm, and more preferably 5 nm to 100 µm.

Figure 2:
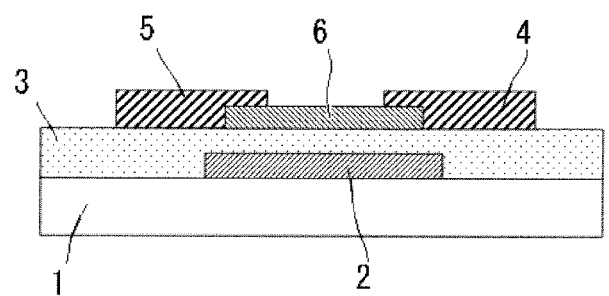
FIG. 2 is a schematic configuration diagram illustrating one example of a bottom gate/top contact field-effect transistor.
Figure 3:
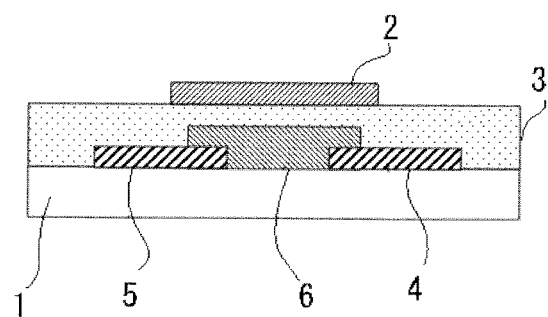
FIG. 3 is a schematic configuration diagram illustrating one example of a top gate/bottom contact field-effect transistor.
Figure 4:
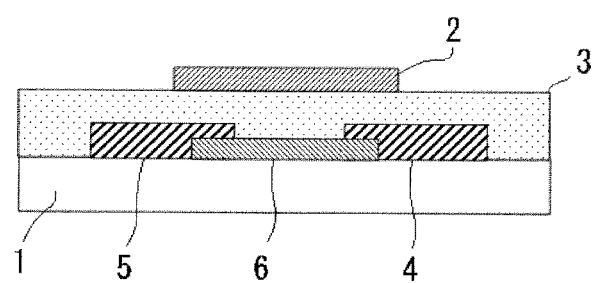
FIG. 4 is a schematic configuration diagram illustrating one example of a top gate/top contact field-effect transistor.

A structure of the field-effect transistor is not particularly restricted and may be appropriately selected according to purpose. Examples thereof include: a bottom gate/bottom contact structure (FIG. 1); a bottom gate/top contact structure (FIG. 2); a top gate/bottom contact structure (FIG. 3); and a top gate/top contact structure (FIG. 4).

Here, in FIG. 1 to FIG. 4, reference numbers 1, 2, 3, 4, 5 and 6 denote a substrate, a gate electrode, a gate insulating layer, a source electrode, a drain electrode, and an active layer, respectively.

A field-effect transistor of the present invention may be favorably used as a field-effect transistor for a pixel drive circuit such as liquid-crystal display, organic EL display and electrochromic display, and for a logic circuit.

(Method for Manufacturing Field-Effect Transistor)

A method for manufacturing a field-effect transistor of the present invention (first manufacturing method) includes:

a step for forming a gate electrode, wherein a gate electrode is formed on a substrate;

a step for forming a gate insulating layer, wherein a gate insulating layer is formed on the gate electrode;

a step for forming a source electrode and a drain electrode, wherein a source electrode and a drain electrode are formed with spacing on the gate insulating layer; and a step for forming an active layer, wherein an active layer formed of an oxide semiconductor is formed in a channel region between the source electrode and the drain electrode on the gate insulating layer.

Also, a method for manufacturing a field-effect transistor of the present invention (second manufacturing method) includes:

a step for forming a source electrode and a drain electrode, wherein a source electrode and a drain electrode are formed with spacing on a substrate;

a step for forming an active layer, wherein an active layer formed of an oxide semiconductor is formed in a channel region between the source electrode and the drain electrode on the substrate;

a step for forming a gate insulating layer, wherein a gate insulating layer is formed on the active layer; and a step for forming a gate electrode, wherein a gate electrode is formed on the gate insulating layer.

<First Manufacturing Method>

The first manufacturing method is explained.

—Substrate—

The substrate is not particularly restricted in terms of its shape, structure, and size, and may be appropriately selected according to purpose.

The substrate is not particularly restricted in terms of its material, and may be appropriately selected according to purpose. Examples thereof include a glass substrate and a plastic substrate.

The glass substrate is not particularly restricted and may be appropriately selected according to purpose. Examples thereof include alkali-free glass and silica glass.

The plastic substrate is not particularly restricted and may be appropriately selected according to purpose. Examples thereof include polycarbonate (PC), polyimide (PI), polyethylene terephthalate (PET), and polyethylene naphthalate (PEN).

Here, it is preferable that the substrate is subject to a pretreatment such as oxygen plasma, UV ozone and UV irradiation cleaning in view of cleaning and improving the adhesion of its surface.

—Step for Forming Gate Electrode—

The step for forming a gate electrode is not particularly restricted as long as it is a step for forming the gate electrode on the substrate, and it may be appropriately selected according to purpose. Examples thereof include: (i) a step of forming a film by a sputtering method or a dip coating method followed by patterning by photolithography; and (ii) a step of directly forming a film of a desired shape by an inkjet, a nanoimprint or a gravure printing process.

—Step for Forming Gate Insulating Layer—

The step for forming the gate insulating layer is not particularly restricted as long as it is a step for forming the gate insulating layer on the gate electrode, and it may be appropriately selected according to purpose. Examples thereof include: (i) a step of forming a film by a sputtering method or a dip coating method, followed by patterning by photolithography; and (ii) a step of directly forming a film of a desired shape by an inkjet, a nanoimprint or a gravure printing process.

—Step for Forming Source Electrode and Drain Electrode—

The step for forming a source electrode and a drain electrode is not particularly restricted as long as the source electrode and the drain electrode are formed with spacing on the gate insulating layer, and it may be appropriately selected according to purpose. Examples thereof include: (i) a step of forming a film by a sputtering method or a dip coating method, followed by patterning by photolithography; and (ii) a step of directly forming a film of a desired shape by an inkjet, a nanoimprint or a gravure printing process.

—Step for Forming Active Layer—

The step for forming an active layer is not particularly restricted as long as it is a step for forming the active layer formed of the oxide semiconductor by coating the coating liquid for forming a metal oxide thin film of the present invention in the channel region between the source electrode and the drain electrode on the gate insulating layer, and it may be appropriately selected according to purpose.

In the step for forming an active layer, it is preferable to adjust the ratio [B/(A+B)] of the number of indium ions (A) in the inorganic indium compound and the sum (B) of the number of calcium ions in the inorganic calcium compound and the number of strontium ions in the inorganic strontium compound in the coating liquid for forming a metal oxide thin film so as to control the oxide semiconductor in terms of volume resistivity, carrier mobility or carrier density, or any combination thereof. Thereby, a field-effect transistor having desired characteristics (e.g. ON/OFF ratio) may be obtained.

In the step for forming an active layer, the coating liquid for forming a metal oxide thin film preferably includes the glycol ethers and the diols, and it is preferable to adjust the mixing ratio of the glycol ethers and the diols in the coating liquid for forming a metal oxide thin film so as to control viscosity of the coating liquid for forming a metal oxide thin film Thereby, a field-effect transistor having superior coating properties and favorable channel forming state may be obtained.

A method for forming an oxide semiconductor by coating the coating liquid for forming a metal oxide thin film is not particularly restricted and may be appropriately selected according to purpose. Examples thereof include a method of coating and drying the coating liquid for forming a metal oxide thin film on the substrate on which the gate insulating layer has been formed, followed baking.

The coating method is not particularly restricted and may be appropriately selected according to purpose. Examples thereof include a screen printing method, a roll coating method, a dip-coating method, a spin-coating method, an inkjet method, and a nanoimprint method. Among these, the inkjet method and the nanoimprint method which enable to control an adhered amount of the coating solution are preferable since a designed channel width (in other words, a desired shape of the active layer) may be obtained in manufacturing the field-effect transistor.

The drying is not particularly restricted, provided that the volatile component in the coating liquid for forming a metal oxide thin film may be removed, and it may be appropriately selected according to purpose. Here, it is unnecessary to remove the volatile component completely in the drying, and the volatile component is removed to an extent it does not interfere with the baking.

A temperature for the baking is not particularly restricted and may be appropriately selected according to purpose. It is preferably 250° C. to 600° C.

In the first manufacturing method, the order of the step for forming a source electrode and a drain electrode and the step for forming an active layer is indifferent. It is possible to carry out the step for forming a source electrode and a drain electrode, followed by the step for forming an active layer, or the step for forming an active layer is carried out, followed by the step for forming a source electrode and a drain electrode.

In the first manufacturing method, when the step for forming a source electrode and a drain electrode is followed by the step for forming an active layer, a bottom gate/bottom contact field-effect transistor may be manufactured.

In the first manufacturing method, when the step for forming an active layer is followed by the step for forming a source electrode and a drain electrode, a bottom gate/top contact field-effect transistor may be manufactured.

Here, a method for manufacturing a bottom gate/bottom contact field-effect transistor is explained with reference to FIG. 5A to FIG. 5D.

Figure 5A:
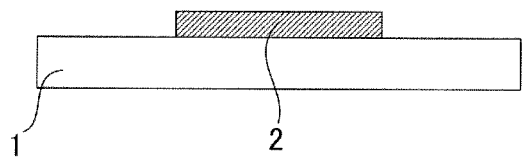
FIG. 5A is a diagram illustrating one example of a method for manufacturing a field-effect transistor of the present invention (part 1).

First, on a substrate 1 formed of a glass substrate, etc., a conductive film formed of aluminum, etc. is formed by a sputtering method, etc., and the conductive film thus formed is subject to patterning by etching. Thereby, a gate electrode 2 is formed (FIG. 5A).

Figure 5B:
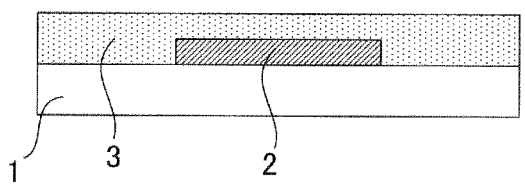
FIG. 5B is a diagram illustrating one example of a method for manufacturing a field-effect transistor of the present invention (part 2).

Next, the gate insulating layer 3 formed of $SiO_2$, etc is formed by sputtering, etc. on the gate electrode 2 and the substrate 1 so as to cover the gate electrode 2 (FIG. 5B).

Figure 5C:
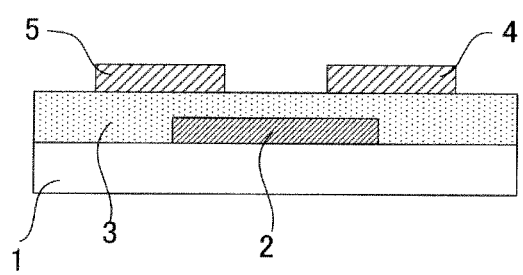
FIG. 5C is a diagram illustrating one example of a method for manufacturing a field-effect transistor of the present invention (part 3).

Next, the conductive film formed of ITO, etc. is formed by sputtering, etc. on the gate insulating layer 3, and the conductive film thus formed is subject to patterning by etching, and the source electrode 4 and the drain electrode 5 are formed (FIG. 5C).

Figure 5D:
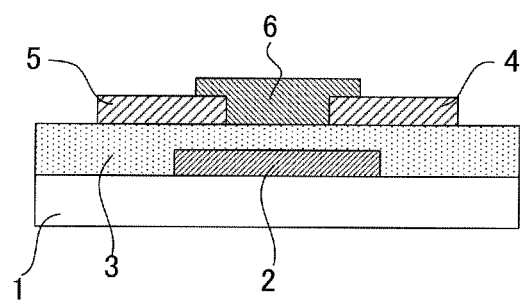
FIG. 5D is a diagram illustrating one example of a method for manufacturing a field-effect transistor of the present invention (part 4).

Next, the coating liquid for forming a metal oxide thin film is coated on the gate insulating layer 3 by an inkjet method, etc. so as to cover the channel region formed between the source electrode 4 and the drain electrode 5, followed by a heat treatment, and the active layer 6 formed of the oxide semiconductor is formed (FIG. 5D).

Thus, the field-effect transistor is manufactured.

<Second Manufacturing Method>

The second manufacturing method is explained.

—Substrate—

The substrate is not particularly restricted and may be appropriately selected according to purpose. Examples thereof include the substrates same as those exemplified for the first manufacturing method.

—Step for Forming Source Electrode and Drain Electrode—

The step for forming a source electrode and a drain electrode is not particularly restricted as long as it forms the source electrode and the drain electrode with spacing on the substrate, and it may be appropriately selected according to purpose. Examples thereof include the step exemplified for the step for forming a source electrode and a drain electrode of the first manufacturing method.

—Step for Forming Active Layer—

The step for forming an active layer is not particularly restricted, as long as the coating liquid for forming a metal oxide thin film of the present invention is coated on the channel region between the source electrode and the drain electrode on the gate substrate to form the active layer formed of the oxide semiconductor, and it may be appropriately selected according to purpose.

A method for forming an oxide semiconductor by coating the coating liquid for forming a metal oxide thin film is not particularly restricted and may be appropriately selected according to purpose. Examples thereof include the method exemplified for the step for forming an active layer of the first manufacturing method.

In the step for forming an active layer, it is preferable to adjust the ratio [B/(A+B)] of the number of indium ions (A) in the inorganic indium compound and the sum (B) of the number of calcium ions in the inorganic calcium compound and the number of strontium ions in the inorganic strontium compound in the coating liquid for forming a metal oxide thin film so as to control the oxide semiconductor in terms of volume resistivity, carrier mobility or carrier density, or any combination thereof. Thereby, a field-effect transistor having desired characteristics (e.g. ON/OFF ratio) may be obtained.

In the step for forming an active layer, the coating liquid for forming a metal oxide thin film preferably includes the glycol ethers and the diols, and it is preferable to adjust the mixing ratio of the glycol ethers and the diols in the coating liquid for forming a metal oxide thin film so as to control viscosity of the coating liquid for forming a metal oxide thin film. Thereby, a field-effect transistor having superior coating properties and favorable channel forming state may be obtained.

—Step for Forming Gate Insulating Layer—

The step for forming a gate insulating layer is not particularly restricted as long as it is a step for forming the gate insulating layer on the active layer, and it may be appropriately selected according to purpose. Examples thereof include the step exemplified for the step for forming a gate insulating layer of the first manufacturing method.

—Step for Forming Gate Electrode—

The step for forming a gate electrode is not particularly restricted as long as it is a step for forming the gate electrode on the gate insulating layer, and it may be appropriately selected according to purpose. Examples thereof include the step exemplified for the step for forming a gate electrode of the first manufacturing method.

In the second manufacturing method, the order of the step for forming a source electrode and a drain electrode and the step for forming an active layer is indifferent. It is possible to carry out the step for forming a source electrode and a drain electrode, followed by the step for forming an active layer, or the step for forming an active layer is carried out, followed by the step for forming a source electrode and a drain electrode.

In the second manufacturing method, when the step for forming a source electrode and a drain electrode is followed by the step for forming an active layer, a top gate/bottom contact field-effect transistor may be manufactured.

In the second manufacturing method, when the step for forming an active layer is followed by the step for forming a source electrode and a drain electrode, a top gate/top contact field-effect transistor may be manufactured.

EXAMPLES

Hereinafter, the present invention is further described in detail with reference to Examples, which however shall not be construed as limiting the scope of the present invention.

Example 1

<Preparation of Coating Liquid for Forming Metal Oxide Thin Film>

In a beaker, 3.55 g of indium nitrate ($In(NO_3)_3 \cdot 3H_2O$) and 0.236 g of calcium nitrate ($Ca(NO_3)_2 \cdot 4H_2O$) were weighed, 20 mL of 1,2-propanediol and 20 mL of ethylene glycol monomethyl ether were added and mixed at a room temperature for dissolution, and a coating liquid for forming a metal oxide thin film was prepared.

A ratio [3/(A+B)] (A denotes a number of indium ions, and B denotes a sum of a number of calcium ions and a number of strontium so ions), a content (% by mass) of the glycol ethers, a proportion of the metal salt with respect to 1 L of the dials and the glycol ethers, and a ratio of a number of indium ions (A) and a sum (C) of a number of zinc ions and a number of magnesium ions ((C)/(A) (%)) in the obtained coating liquid for forming a metal oxide thin film are shown in Table 2.

<Preparation of Field-Effect Transistor>

—Formation of Gate Electrode—

A molybdenum film was formed on a glass substrate by DC sputtering such that the molybdenum film had a thickness of about 100 nm. Thereafter, a photoresist was coated followed by prebaking, exposure by an exposure apparatus and development, and a resist pattern similar to a pattern of a gate electrode to be formed was formed. Further, etching was carried out with an etching solution formed of phosphoric acid—nitric acid—acetic acid, and the molybdenum film in a region where the resist pattern was not formed was removed. Thereafter, the resist pattern was removed, and a gate electrode was formed.

—Formation of Gate Insulating Layer—

On the gate electrode thus formed and the glass substrate, a $SiO_2$ film was formed by RF sputtering such that the film had a thickness of about 200 nm. Thereafter, a photoresist was coated followed by prebaking, exposure by an exposure apparatus and development, and a resist pattern similar to a pattern of a gate insulating layer to be formed was formed. Further, etching with buffered hydrofluoric acid was carried out, and the $SiO_2$ film in a region where the resist pattern was not formed was removed. Thereafter, the resist pattern was removed, and the gate insulating layer was formed.

—Formation of Source Electrode and Drain Electrode—

A ITO film ($In_2O_3$—$SnO_2$ (5% by mass)) was formed on the gate insulating layer by DC sputtering such that a ITO film had a thickness of about 100 nm. Thereafter, a photoresist was coated on the ITO film, followed by prebaking, exposure by an exposure apparatus and development, and a resist pattern similar to a pattern of a source electrode and a drain electrode to be formed was formed. Further, etching was carried out with an oxalic acid-based etching solution, and the ITO film in a region where the resist pattern was not formed was removed. Thereafter, the resist pattern was removed, and a source electrode and a drain electrode formed of the ITO film were formed. At this time, a channel width defined by a source electrode width was 50 μm, and a channel length defined between the source-drain electrodes was 50 μm.

—Formation of Active Layer—

The coating liquid for forming a metal oxide thin film was applied with an inkjet apparatus on a channel between the source electrode and the drain electrode thus formed.

The substrate was dried for 10 minutes on a hot plate heated at 120° C., then baked at 350° C. for 1 hour in the atmosphere and further annealed at 300° C. for 3 hours in the atmosphere, and an active layer was obtained. A channel section of the active layer thus obtained had a thickness of about 15 nm.

Thus, a field-effect transistor was prepared.

<Evaluation>

—Channel Forming State (Coating Properties)—

In the preparation of the field-effect transistor, spreading of the coating solution was observed with an optical microscope when the coating liquid for forming a metal oxide thin film was coated by the inkjet apparatus, and a channel forming state was evaluated based on the following evaluation criteria. Results are shown in Table 3.

Figure 6:
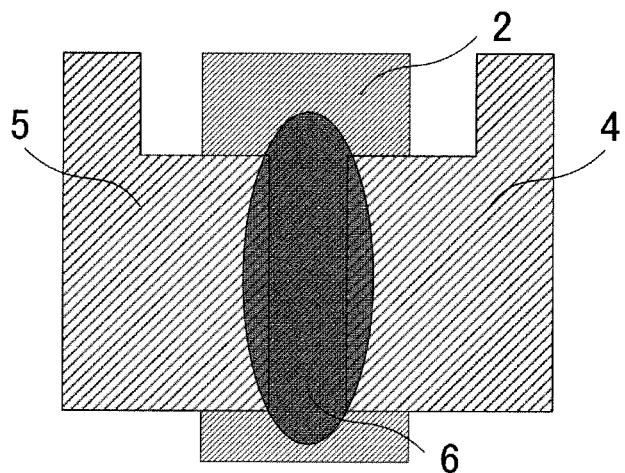
FIG. 6 is a schematic diagram indicating that coating properties of a coating liquid for forming a metal oxide thin film are in a good condition.

A: The active layer spread between the source electrode and the drain electrode without spreading out from the gate electrode (see FIG. 6).

Figure 7:
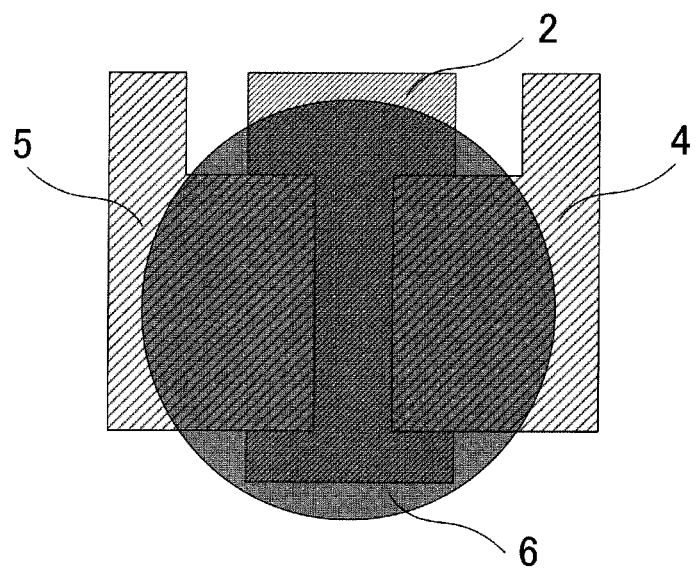
FIG. 7 is a schematic diagram indicating that coating properties of a coating liquid for forming a metal oxide thin film are in a poor condition.

B: The active layer spread outside between the source electrode and the drain electrode, and it spread out from the gate electrode (see FIG. 7).

—Volume Resistivity—

The obtained field-effect transistor was measured for a current by a two-terminal method using a semiconductor parameter analyzer apparatus (Semiconductor Parameter Analyzer 4156C, manufactured by Agilent Technologies) when a voltage of 0V to ±20V was applied between the source and the drain, and a volume resistivity of the active layer was measured. Results are shown in Table 3.

—Carrier Mobility and ON/OFF Ratio—

Figure 8:
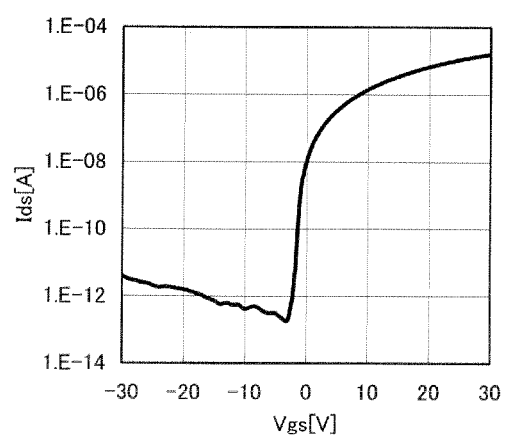
FIG. 8 is a plot illustrating a relation between a gate voltage Vgs and a source-drain current of a field-effect transistor prepared in Example 1.

For the obtained field-effect transistor, a relation between a gate voltage Vgs and a source-drain current Ids was determined using the semiconductor parameter analyzer apparatus (Semiconductor Parameter Analyzer 4156C, manufactured by Agilent Technologies) when a source-drain voltage Vds was 20V. Results are shown in a plot of FIG. 8. It is confirmed from FIG. 8 that favorable transistor characteristics were obtained. Here, in FIG. 8, "E" denotes a "power of 10". For example, "E-04" is "0.0001".

The carrier mobility was calculated in a saturation region. Also, an ON/OFF ratio was obtained. Here, in the ON/OFF ratio, the ON value is an Ids value at 30V. Results are shown in Table 3.

Examples 2 to 39 and Comparative Examples 1 to 5

<Preparation of Coating Liquid for Forming Metal Oxide Thin Film>

Coating liquids for forming a metal oxide thin film of Examples 2 to 39 and Comparative Examples 1 to 5 were prepared in the same manner as Example 1 except that the composition of the coating liquid for forming a metal oxide thin film in Example 1 was changed to the compositions shown in Table 1.

The ratio [B/(A+B)], the content (% by mass) of the glycol ethers, the proportion of the metal salt with respect to 1 L of the diols and the glycol ethers, the ratio of the number of indium ions (A) and the sum (C) of the number of zinc ions and the number of magnesium ions ((C)/(A) (%)) in the obtained coating liquids for forming a metal oxide thin film are shown in Table 2.

In Comparative Example 3, the B denotes a number of copper ons. In Comparative Example 4, the B denotes a number of cobalt ions. In Comparative Example 5, the B denotes a number of nickel ions.

<Preparation and Evaluation of Field-Effect Transistor>

Using the coating liquids for forming a metal oxide thin film obtained in Examples 2 to 39 and Comparative Examples 1 to 5, field-effect transistors were prepared and evaluated similarly to Example 1. Results are shown in Table 3.

TABLE 1

| | | Material A | | Material B | | Material C | | Diols | | Glycol ethers | |
|---|---|---|---|---|---|---|---|---|---|---|---|
| | | Type | (g) | Type | (g) | Type | (g) | Type | (mL) | Type | (mL) |
| Ex. | 1 | indium nitrate | 3.55 | calcium nitrate | 0.236 | | | 1,2-propanediol | 20 | ethylene glycol monomethyl ether | 20 |
| | 2 | | 3.55 | | 0.12 | | | | 20 | monomethyl ether | 20 |
| | 3 | | 3.55 | | 0.99 | | | | 20 | | 20 |
| | 4 | | 3.55 | strontium chloride | 0.267 | | | | 20 | | 20 |
| | 5 | | 3.55 | | 0.133 | | | | 20 | | 20 |
| | 6 | | 3.55 | | 1.066 | | | | 20 | | 20 |
| | 7 | | 3.55 | calcium nitrate | 0.262 | | | | 20 | | 20 |
| | 8 | | 3.55 | | 0.59 | | | | 20 | | 20 |
| | 9 | | 3.55 | | 0.074 | | | | 20 | | 20 |
| | 10 | | 3.55 | | 1.27 | | | | 20 | | 20 |
| | 11 | | 3.55 | strontium chloride | 0.295 | | | | 20 | | 20 |
| | 12 | | 3.55 | | 0.667 | | | | 20 | | 20 |
| | 13 | | 3.55 | | 0.082 | | | | 20 | | 20 |
| | 14 | | 3.55 | | 1.435 | | | | 20 | | 20 |
| | 15 | indium sulfate | 6.80 | calcium nitrate | 0.236 | | | | 20 | | 20 |
| | 16 | indium chloride | 2.93 | | 0.236 | | | | 20 | | 20 |
| | 17 | indium sulfate | 6.80 | strontium chloride | 0.133 | | | | 20 | | 20 |
| | 18 | indium chloride | 2.93 | | 0.133 | | | | 20 | | 20 |
| | 19 | indium nitrate | 3.55 | calcium sulfate | 0.145 | | | | 20 | | 20 |
| | 20 | | 3.55 | calcium chloride | 0.147 | | | | 20 | | 20 |
| | 21 | | 3.55 | strontium sulfate | 0.091 | | | | 20 | | 20 |
| | 22 | | 3.55 | strontium nitrate | 0.284 | | | | 20 | | 20 |
| | 23 | | 3.55 | calcium nitrate | 0.236 | | | | 40 | | |
| Ex. | 24 | indium nitrate | 3.55 | calcium nitrate | 0.236 | | | 1,2-ethanediol | 20 | ethylene glycol | 20 |
| | 25 | | 3.55 | | 0.236 | | | 1,3-butanediol | 20 | monomethyl ether | 20 |
| | 26 | | 3.55 | | 0.236 | | | | | | 40 |
| | 27 | | 3.55 | | 0.236 | | | 1,2-propanediol | 20 | ethylene glycol mono-isopropyl ether | 20 |
| | 28 | | 3.55 | | 0.236 | | | | 20 | ethylene glycol mono-isobutyl ether | 20 |
| | 29 | | 3.55 | strontium chloride | 0.133 | | | | | | 40 |
| | 30 | | 3.55 | | 0.133 | | | 1,2-ethanediol | 20 | | 20 |
| | 31 | | 3.55 | | 0.133 | | | 1,3-butanediol | 20 | ethylene glycol | 20 |
| | 32 | | 3.55 | | 0.133 | | | | | | 40 |
| | 33 | | 3.55 | | 0.133 | | | 1,2-propanediol | 20 | ethylene glycol mono-isopropyl ether | 20 |

TABLE 1-continued

| | | Material A | | Material B | | Material C | | Diols | | Glycol ethers | |
|---|---|---|---|---|---|---|---|---|---|---|---|
| | | Type | (g) | Type | (g) | Type | (g) | Type | (mL) | Type | (mL) |
| | 34 | | 3.55 | | 0.133 | | | | 20 | ethylene glycol mono-isobutyl ether | 20 |
| | 35 | | 3.55 | calcium nitrate | 0.12 | | | | 20 | ethylene glycol monomethyl ether | 20 |
| | | | | strontium chloride | 0.133 | | | | | | |
| | 36 | | 3.55 | calcium nitrate | 0.236 | zinc nitrate | 0.15 | | 20 | | 20 |
| | 37 | | 3.55 | | 0.236 | magnesium nitrate | 0.13 | | 20 | | 20 |
| | 38 | | 3.55 | strontium chloride | 0.133 | zinc nitrate | 0.15 | | 20 | | 20 |
| | 39 | | 3.55 | | 0.133 | magnesium nitrate | 0.13 | | 20 | | 20 |
| Comp. Ex. | 1 | | 3.55 | calcium nitrate | 0.236 | | | (*1) | | | 40 |
| | 2 | | 3.55 | strontium chloride | 0.133 | | | | | | 40 |
| | 3 | | 3.55 | copper nitrate | 0.242 | | | 1,2-propanediol | 20 | ethylene glycol monomethyl ether | 20 |
| | 4 | | 3.55 | cobalt nitrate | 0.29 | | | | 20 | | 20 |
| | 5 | | 3.55 | nickel nitrate | 0.29 | | | | 20 | | 20 |

In Table 1, (*1) denotes water.

In Table 1, indium nitrate denotes $In(NO_3)_3 \cdot 3H_2O$; indium sulfate denotes $In_2(SO_4)_3 \cdot 9H_2O$; indium chloride denotes $InCl_3 \cdot 4H_2O$; calcium nitrate denotes $Ca(NO_3)_2 \cdot 4H_2O$; calcium sulfate denotes $Ca(SO_4) \cdot 1H_2O$; calcium chloride denotes $CaCl_2 \cdot 2H_2O$; strontium chloride denotes $SrCl_2 \cdot 6H_2O$; strontium sulfate denotes anhydrous $Sr(SO_4)$; strontium nitrate denotes $Sr(NO_3)_2 \cdot 4H_2O$; zinc nitrate denotes $Zn(NO_3)_2 \cdot 6H_2O$; magnesium nitrate denotes $Mg(NO_3)_2 \cdot 6H_2O$; copper nitrate denotes $Cu(NO_3)_2 \cdot 3H_2O$; cobalt nitrate denotes $Co(NO_3)_2 \cdot 6H_2O$; and nickel nitrate denotes $Ni(NO_3)_2 \cdot 6H_2O$.

TABLE 2

| | | B/(A + B) | Content of glycol ethers (% by mass) | Proportion of metal salts to 1 L of diols and glycol ethers (mol) | Ratio ((C)/(A)(%)) of In ions (A) and sum of Zn and Mg ions (C) |
|---|---|---|---|---|---|
| Ex. | 1 | 0.091 | 44.1% | 0.28 | 0 |
| | 2 | 0.048 | 44.2% | 0.26 | 0 |
| | 3 | 0.295 | 43.3% | 0.35 | 0 |
| | 4 | 0.091 | 44.0% | 0.28 | 0 |
| | 5 | 0.047 | 44.2% | 0.26 | 0 |
| | 6 | 0.286 | 43.2% | 0.35 | 0 |
| | 7 | 0.100 | 44.0% | 0.28 | 0 |
| | 8 | 0.200 | 43.7% | 0.31 | 0 |
| | 9 | 0.030 | 44.2% | 0.26 | 0 |
| | 10 | 0.350 | 43.0% | 0.38 | 0 |
| | 11 | 0.100 | 44.0% | 0.28 | 0 |
| | 12 | 0.200 | 43.6% | 0.31 | 0 |
| | 13 | 0.030 | 44.2% | 0.26 | 0 |
| | 14 | 0.350 | 42.9% | 0.38 | 0 |
| | 15 | 0.091 | 41.0% | 0.28 | 0 |
| | 16 | 0.091 | 44.7% | 0.27 | 0 |
| | 17 | 0.047 | 41.1% | 0.26 | 0 |
| | 18 | 0.047 | 44.8% | 0.26 | 0 |
| | 19 | 0.091 | 44.1% | 0.28 | 0 |
| | 20 | 0.091 | 44.1% | 0.28 | 0 |
| | 21 | 0.047 | 44.2% | 0.26 | 0 |
| | 22 | 0.091 | 44.0% | 0.28 | 0 |
| | 23 | 0.091 | 0.0% | 0.28 | 0 |
| | 24 | 0.091 | 42.2% | 0.28 | 0 |
| | 25 | 0.091 | 44.7% | 0.28 | 0 |
| | 26 | 0.091 | 91.1% | 0.28 | 0 |
| | 27 | 0.091 | 42.4% | 0.28 | 0 |
| | 28 | 0.091 | 42.1% | 0.28 | 0 |
| | 29 | 0.047 | 0.0% | 0.26 | 0 |
| | 30 | 0.047 | 42.3% | 0.26 | 0 |
| | 31 | 0.047 | 44.8% | 0.26 | 0 |
| | 32 | 0.047 | 91.3% | 0.26 | 0 |
| | 33 | 0.047 | 42.5% | 0.26 | 0 |
| | 34 | 0.047 | 42.2% | 0.26 | 0 |
| | 35 | 0.096 | 44.2% | 0.26 | 0 |
| | 36 | 0.091 | 44.1% | 0.28 | 5 |
| | 37 | 0.091 | 44.1% | 0.28 | 5 |
| | 38 | 0.047 | 44.2% | 0.26 | 5 |
| | 39 | 0.047 | 44.2% | 0.26 | 5 |
| Comp. Ex. | 1 | 0.091 | 91.4% | 0.28 | 0 |
| | 2 | 0.047 | 91.6% | 0.26 | 0 |
| | 3 | 0.091 | 44.1% | 0.28 | 0 |
| | 4 | 0.091 | 44.0% | 0.28 | 0 |
| | 5 | 0.091 | 44.0% | 0.28 | 0 |

TABLE 3

| | | Channel forming state | Volume resistivity ($\Omega$cm) | Carrier mobility ($cm^2$/Vs) | ON/OFF ratio |
|---|---|---|---|---|---|
| Ex. | 1 | A | $3 \times 10^1$ | 1.9 | $1.6 \times 10^7$ |
| | 2 | A | $4 \times 10^0$ | 3.5 | $1.0 \times 10^8$ |
| | 3 | A | $9 \times 10^1$ | 0.6 | $8.2 \times 10^6$ |
| | 4 | A | $6 \times 10^1$ | 2.3 | $1.8 \times 10^7$ |
| | 5 | A | $4 \times 10^1$ | 1.7 | $7.3 \times 10^6$ |
| | 6 | A | $7 \times 10^2$ | 0.4 | $1.4 \times 10^6$ |
| | 7 | A | $5 \times 10^1$ | 1.6 | $1.1 \times 10^7$ |
| | 8 | A | $8 \times 10^1$ | 1.2 | $9.0 \times 10^6$ |
| | 9 | A | $3 \times 10^2$ | 0.1 | $1.2 \times 10^6$ |
| | 10 | A | $6 \times 10^2$ | 0.2 | $3.1 \times 10^6$ |
| | 11 | A | $7 \times 10^1$ | 2.0 | $1.6 \times 10^7$ |
| | 12 | A | $8 \times 10^1$ | 1.5 | $6.5 \times 10^6$ |
| | 13 | A | $5 \times 10^2$ | 0.2 | $3.0 \times 10^6$ |
| | 14 | A | $3 \times 10^2$ | 0.1 | $1.5 \times 10^6$ |
| | 15 | A | $4 \times 10^1$ | 1.6 | $1.6 \times 10^7$ |
| | 16 | A | $2 \times 10^1$ | 1.8 | $6.5 \times 10^7$ |
| | 17 | A | $7 \times 10^1$ | 1.5 | $4.2 \times 10^7$ |
| | 18 | A | $6 \times 10^1$ | 1.4 | $1.8 \times 10^7$ |
| | 19 | A | $8 \times 10^1$ | 1.5 | $2.4 \times 10^7$ |
| | 20 | A | $3 \times 10^1$ | 1.7 | $5.4 \times 10^7$ |
| | 21 | A | $9 \times 10^1$ | 1.3 | $1.4 \times 10^7$ |
| | 22 | A | $7 \times 10^1$ | 1.4 | $1.2 \times 10^7$ |
| | 23 | A | $3 \times 10^1$ | 1.7 | $6.8 \times 10^7$ |
| | 24 | A | $6 \times 10^1$ | 1.5 | $3.2 \times 10^7$ |
| | 25 | A | $5 \times 10^1$ | 1.5 | $2.5 \times 10^7$ |
| | 26 | A | $4 \times 10^1$ | 1.6 | $2.2 \times 10^7$ |
| | 27 | A | $2 \times 10^1$ | 2.0 | $3.2 \times 10^7$ |
| | 28 | A | $3 \times 10^1$ | 1.8 | $2.2 \times 10^7$ |
| | 29 | A | $8 \times 10^1$ | 1.4 | $1.2 \times 10^7$ |
| | 30 | A | $5 \times 10^1$ | 1.6 | $4.0 \times 10^7$ |
| | 31 | A | $6 \times 10^1$ | 1.7 | $1.9 \times 10^7$ |
| | 32 | A | $7 \times 10^1$ | 1.5 | $1.9 \times 10^7$ |
| | 33 | A | $8 \times 10^1$ | 1.4 | $1.8 \times 10^7$ |

TABLE 3-continued

|  |  | Channel forming state | Volume resistivity (Ωcm) | Carrier mobility (cm²/Vs) | ON/OFF ratio |
|---|---|---|---|---|---|
|  | 34 | A | $4 \times 10^1$ | 1.8 | $3.8 \times 10^7$ |
|  | 35 | A | $4 \times 10^1$ | 2.0 | $3.9 \times 10^7$ |
|  | 36 | A | $6 \times 10^1$ | 1.5 | $2.0 \times 10^7$ |
|  | 37 | A | $7 \times 10^1$ | 1.4 | $1.2 \times 10^7$ |
|  | 38 | A | $6 \times 10^1$ | 1.6 | $3.6 \times 10^7$ |
|  | 39 | A | $4 \times 10^1$ | 1.8 | $5.2 \times 10^7$ |
| Comp. Ex. | 1 | B | $3 \times 10^1$ | — | — |
|  | 2 | B | $3 \times 10^1$ | — | — |
|  | 3 | A | $2 \times 10^2$ | — | — |
|  | 4 | A | $6 \times 10^2$ | — | — |
|  | 5 | A | $5 \times 10^2$ | — | — |

In Table 3, "—" denotes unmeasurable.

The coating liquids for forming a metal oxide thin film of the present invention of Examples 1 to 39 had a favorable channel forming state due to their superior coating properties, and the field-effect transistors using the oxide semiconductor obtained by coating the coating liquids for forming a metal oxide thin film as an active layer had an appropriate volume resistivity of the active layer required for an active layer of a field-effect transistor, had a high carrier mobility and a large ON/OFF ratio, and demonstrated favorable transistor characteristics.

Also, the coating solutions for forming an oxide semiconductor thin layer of Comparative Examples 1 and 2 had poor coating properties and an insufficient channel forming state, and an evaluation of the field-effect transistor could not be conducted.

Regarding the coating solution for forming an oxide thin layer of Comparative Examples 3 to 5, the source-drain current hardly changed even though the gate voltage Vgs varied, and semiconductor properties were not indicated.

Aspects of the present invention are as follows.

<1> A coating liquid for forming a metal oxide thin film, including:
an inorganic indium compound:
an inorganic calcium compound or an inorganic strontium compound, or both thereof; and
an organic solvent.

<2> The coating liquid for forming a metal oxide thin film according to <1>,
wherein the inorganic indium compound is indium nitrate, indium sulfate or indium chloride, or any combination thereof,
wherein the inorganic calcium compound is calcium nitrate, calcium sulfate or calcium chloride, or any combination thereof, and
wherein the inorganic strontium compound is strontium nitrate, strontium sulfate or strontium chloride or any combination thereof.

<3> The coating liquid for forming a metal oxide thin film according to any one of <1> to <2>, wherein a number of indium ions (A) in the inorganic indium compound and a sum (B) of a number of calcium ions in the inorganic calcium compound and a number of strontium ions in the inorganic strontium compound satisfy Formula (1):

$$0.040 \leq [B/(A+B)] \leq 0.200 \quad \text{Formula (1)}.$$

<4> The coating liquid for forming a metal oxide thin film according to any one of <1> to <3>, wherein the organic solvent is glycol ethers or diols, or any combination thereof.

<5> A metal oxide thin film obtained by coating and drying the coating liquid for forming a metal oxide thin film according to any one of <1> to <4> on an object to be coated, followed by baking.

<6> A field-effect transistor, including:
a gate electrode which applies a gate voltage,
a source electrode and a drain electrode which retrieve a current,
an active layer formed of an oxide semiconductor formed between the source electrode and the drain electrode,
a gate insulating layer formed between the gate electrode and the active layer,
wherein the oxide semiconductor is an oxide semiconductor formed by coating the coating liquid for forming a metal oxide thin film according to any one of <1> to <4>.

<7> A method for manufacturing a field-effect transistor, including:
a step for forming a gate electrode, wherein a gate electrode is formed on a substrate;
a step for forming a gate insulating layer, wherein a gate insulating layer is formed on the gate electrode;
a step for forming a source electrode and a drain electrode, wherein a source electrode and a drain electrode are formed with spacing on the gate insulating layer; and
a step for forming an active layer, wherein an active layer formed of an oxide semiconductor is formed in a channel region between the source electrode and the drain electrode on the gate insulating layer,
wherein the step for forming an active layer is a step for forming the active layer formed of the oxide semiconductor by coating the coating liquid for forming a metal oxide thin film according to any one of <1> to <4> on the gate insulating layer.

<8> A method for manufacturing a field-effect transistor, including:
a step for forming a source electrode and a drain electrode, wherein a source electrode and a drain electrode are formed with spacing on a substrate,
a step for forming an active layer, wherein an active layer formed of an oxide semiconductor is formed in a channel region between the source electrode and the drain electrode on the substrate,
a step for forming a gate insulating layer, wherein a gate insulating layer is formed on the active layer,
a step for forming a gate electrode, wherein a gate electrode is formed on the gate insulating layer,
wherein the step for forming an active layer is a step for forming the active layer formed of the oxide semiconductor by coating the coating liquid for forming a metal oxide thin film according to any one of <1> to <4> on the substrate.

<9> The method for manufacturing a field-effect transistor according to any one of <7> to <8>, wherein, in the step for forming an active layer, by adjusting a ratio [B/(A+B)] of a number of indium ions (A) in the inorganic indium compound and a sum (B) of a number of calcium ions in the inorganic calcium compound and a number of strontium ions in the inorganic strontium compound in the coating liquid for forming a metal oxide thin film, the oxide semiconductor is controlled in terms of volume resistivity, carrier mobility or carrier density, or any combination thereof.

<10> The method for manufacturing a field-effect transistor according to any one of <7> to <9>,
wherein the coating liquid for forming a metal oxide thin film includes glycol ethers and diols, and
wherein, in the step for forming an active layer, by adjusting a mixing ratio of the glycol ethers and the diols in the coating liquid for forming a metal oxide thin film, a viscosity of the coating liquid for forming a metal oxide thin film is controlled.

REFERENCE SIGNS LIST 1 substrate
2 gate electrode
3 gate insulating layer
4 source electrode
5 drain electrode
6 active layer

The invention claimed is:

1. A coating liquid for forming a metal oxide thin film, comprising:
   metal salts including an inorganic indium compound and one or both of an inorganic calcium compound and an inorganic strontium compound; and
   an organic solvent including a glycol ether and a diol, wherein the diol is at least one selected from diethylene glycol, 1,2-propanediol and 1,3-butanediol,
   wherein a content of the metal salts in the coating liquid for forming a metal oxide thin film is 0.26 mol to 0.38 mol of the metal salts to 1 L of the organic solvent.

2. The coating liquid for forming a metal oxide thin film according to claim 1,
   wherein the inorganic indium compound is indium nitrate, indium sulfate or indium chloride, or any combination thereof,
   wherein the inorganic calcium compound is calcium nitrate, calcium sulfate or calcium chloride, or any combination thereof, and
   wherein the inorganic strontium compound is strontium nitrate, strontium sulfate or strontium chloride or any combination thereof.

3. The coating liquid for forming a metal oxide thin film according to claim 1, wherein a number of indium ions (A) in the inorganic indium compound and a sum (B) of a number of calcium ions in the inorganic calcium compound and a number of strontium ions in the inorganic strontium compound satisfy Formula (1):

$$0.040 \leq [B/(A+B)] \leq 0.200 \quad \text{Formula (1)}.$$

4. The coating liquid for forming a metal oxide thin film according to claim 1, wherein a total amount of the organic solvent in the coating liquid is less than or equal to 40 mL.

5. A method of producing a metal oxide thin film obtained by coating and drying a coating liquid for forming a metal oxide thin film on an object to be coated, followed by baking, wherein the coating liquid for forming a metal oxide thin film comprises:
   metal salts including an inorganic indium compound and one or both of an inorganic calcium compound and an inorganic strontium compound; and
   an organic solvent including a glycol ether and a diol, wherein the diol is at least one selected from diethylene glycol, 1,2-propanediol and 1,3-butanediol,
   wherein a content of the metal salts in the coating liquid for forming a metal oxide thin film is 0.26 mol to 0.38 mol of the metal salts to 1 L of the organic solvent.

6. The method according to claim 5, wherein a total amount of the organic solvent in the coating liquid is less than or equal to 40 mL.

7. A method for manufacturing a field-effect transistor, comprising:
   forming a gate electrode, wherein a gate electrode is formed on a substrate;
   forming a gate insulating layer, wherein a gate insulating layer is formed on the gate electrode;
   forming a source electrode and a drain electrode, wherein a source electrode and a drain electrode are formed with spacing on the gate insulating layer; and
   forming an active layer, wherein an active layer formed of an oxide semiconductor is formed in a channel region between the source electrode and the drain electrode on the gate insulating layer,
   wherein the forming an active layer forms the active layer formed of the oxide semiconductor by coating a coating liquid for forming a metal oxide thin film on the gate insulating layer, and
   wherein the coating liquid for forming a metal oxide thin film comprises:
      metal salts including an inorganic indium compound and one or both of an inorganic calcium compound and an inorganic strontium compound; and
      an organic solvent including a glycol ether and a diol, wherein the diol is at least one selected from diethylene glycol, 1,2-propanediol and 1,3-butanediol,
      wherein a content of the metal salts in the coating liquid for forming a metal oxide thin film is 0.26 mol to 0.38 mol of the metal salts to 1 L of the organic solvent.

8. The method for manufacturing a field-effect transistor according to claim 7, wherein, in the forming an active layer, by adjusting the ratio [B/(A+B)] of the number of indium ions (A) in the inorganic indium compound and the sum (B) of the number of calcium ions in the inorganic calcium compound and the number of strontium ions in the inorganic strontium compound in the coating liquid for forming a metal oxide thin film, the oxide semiconductor is controlled in terms of volume resistivity, carrier mobility or carrier density, or any combination thereof.

9. The method for manufacturing a field-effect transistor according to claim 7,
   wherein, in the forming an active layer, by adjusting a mixing ratio of the glycol ethers and the diols in the coating liquid for forming a metal oxide thin film, viscosity of the coating liquid for forming a metal oxide thin film is controlled.

10. A method for manufacturing a field-effect transistor, comprising:
    forming a source electrode and a drain electrode, wherein a source electrode and a drain electrode are formed with spacing on a substrate,
    forming an active layer, wherein an active layer formed of an oxide semiconductor is formed in a channel region between the source electrode and the drain electrode on the substrate,
    forming a gate insulating layer, wherein a gate insulating layer is formed on the active layer,
    forming a gate electrode, wherein a gate electrode is formed on the gate insulating layer,
    wherein the forming an active layer forms the active layer formed of the oxide semiconductor by coating a coating liquid for forming a metal oxide thin film on the substrate, and
    wherein the coating liquid for forming a metal oxide thin film comprises:
       metal salts including an inorganic indium compound and one or both of an inorganic calcium compound and an inorganic strontium compound; and
       an organic solvent including a glycol ether and a diol, wherein the diol is at least one selected from diethylene glycol, 1,2-propanediol and 1,3-butanediol,
       wherein a content of the metal salts in the coating liquid for forming a metal oxide thin film is 0.26 mol to 0.38 mol of the metal salts to 1 L of the organic solvent.

11. The method for manufacturing a field-effect transistor according to claim 10, wherein, in the forming an active layer, by adjusting the ratio [B/(A+B)] of the number of indium ions (A) in the inorganic indium compound and the sum (B) of the number of calcium ions in the inorganic calcium compound and the number of strontium ions in the inorganic strontium compound in the coating liquid for forming a metal oxide thin film, the oxide semiconductor is controlled in terms of volume resistivity, carrier mobility or carrier density, or any combination thereof.

12. The method for manufacturing a field-effect transistor according to claim 10,
wherein, in the forming an active layer, by adjusting a mixing ratio of the glycol ethers and the diols in the coating liquid for forming a metal oxide thin film, viscosity of the coating liquid for forming a metal oxide thin film is controlled.

13. The method for manufacturing a field-effect transistor according to claim 10, wherein a total amount of the organic solvent in the coating liquid is less than or equal to 40 mL.

* * * * *